(12) United States Patent
Ko et al.

(10) Patent No.: US 8,804,453 B2
(45) Date of Patent: Aug. 12, 2014

(54) INTEGRATED CIRCUIT INCLUDING SEMICONDUCTOR MEMORY DEVICES HAVING STACK STRUCTURE

(71) Applicant: SK hynix Inc., Gyeonggi-do (KR)

(72) Inventors: Jae-Bum Ko, Gyeonggi-do (KR); Sang-Jin Byeon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/681,134

(22) Filed: Nov. 19, 2012

(65) Prior Publication Data
US 2014/0064013 A1  Mar. 6, 2014

(30) Foreign Application Priority Data
Aug. 31, 2012 (KR) .................. 10-2012-0096475

(51) Int. Cl.
*G11C 8/10* (2006.01)
*G11C 8/12* (2006.01)
*G11C 8/08* (2006.01)

(52) U.S. Cl.
CPC .. *G11C 8/10* (2013.01); *G11C 8/12* (2013.01); *G11C 8/08* (2013.01)
USPC .................................................. 365/230.06

(58) Field of Classification Search
CPC ............... G11C 8/10; G11C 8/12; G11C 8/08
USPC .................................................. 365/230.06
See application file for complete search history.

(56) References Cited

U.S. PATENT DOCUMENTS 8,411,514 B2 *  4/2013  Kim et al. ............... 365/189.05

FOREIGN PATENT DOCUMENTS

KR    1020070036615    4/2007

* cited by examiner

*Primary Examiner* — Hoai V Ho
*Assistant Examiner* — Tri Hoang
(74) *Attorney, Agent, or Firm* — IP & T Group LLP

(57) ABSTRACT

An integrated circuit includes a plurality of mode register set (MRS) setting blocks configured to generate a plurality of additive latency (AL) codes in response to an MRS signal, and a decoding unit configured to decoding the plurality of AL codes in response to a stack information signal to generate a plurality of AL setting signals.

8 Claims, 2 Drawing Sheets

INTEGRATED CIRCUIT INCLUDING SEMICONDUCTOR MEMORY DEVICES HAVING STACK STRUCTURE

CROSS-REFERENCE TO RELATED APPLICATIONS

The present application claims priority of Korean Patent Application No. 10-2012-0096475, filed on Aug. 31, 2012, which is incorporated herein by reference in its entirety.

BACKGROUND

1. Field

Exemplary embodiments of the present invention relate to semiconductor design technology, and more particularly, to an integrated circuit including a plurality of semiconductor memory devices having a stack structure.

2. Description of the Related Art

Semiconductor memory devices have been continuously improved to increase their operating speed according to an increase in the degree of integration of semiconductor memory devices. To increase the operating speed, a so-called synchronous memory device capable of operating in synchronization with an external clock has emerged. The first proposed semiconductor memory device is a so-called single data rate (SDR) synchronous memory device for inputting and outputting one datum in one cycle of a clock through one data pin in synchronization with the rising edge of the clock outside the semiconductor memory device.

The SDR synchronous memory device is insufficient to satisfy the speed of a system that requires a high-speed operation. For this reason, a double data rate (DDR) synchronous memory device using a method of processing two data in one clock cycle has been proposed.

Two data are consecutively inputted and outputted through each of the data I/O pins of the DDR synchronous memory device in synchronism with the rising edge and the falling edge of an external clock. Although the frequency of a clock is not increased, the DDR synchronous memory device provides a bandwidth that is at least twice that of the SDR synchronous memory device, thereby being capable of embodying a high-speed operation that much.

Meanwhile, to operate the synchronous memory device in synchronization with a system clock, several types of new operating concepts that do not exist in the existing memory devices have been added. For example, the several types of new operating concepts include a CAS latency ("CL"), a burst length ("BL"), and an additive latency ("AL").

The CL refers to the number of system clock cycles until data is externally outputted after a read or write command is inputted to a memory device. The BL refers to the number of data that are consecutively inputted or outputted in response to one data access. The AL is a concept that is newly introduced into a DDR memory device, and it refers to the number of clock cycles from timing at which a read or write command is inputted to a memory device to a RAS to CAS delay ("tRCD") based on timing at which an active command is inputted. A synchronous memory device consecutively receives an active command, read/write commands, and a precharge command for data access. The AL indicates the advanced input timing of the read/write command defeating predetermined timing.

For example, if AL is 2, an internal read/write operation may be performed after 2 clock cycles since a read/write command is inputted to a memory device. In the case of a synchronous memory device without AL, a corresponding data access operation is performed in response to a read/write command received after system clock cycles corresponding to tRCD since an active command is inputted to the synchronous memory device. On the other hand, in the case of a synchronous memory device with AL, after an active command is inputted to the synchronous memory device, a read or write command is previously received quickly corresponding to AL even if system clock cycles corresponding to tRCD do not elapse.

Accordingly, in conventional semiconductor memory devices, the value of read latency ("RL") may be represented by the sum of the value of CL and the value of AL. Here, the value of RL is equal to the sum of the value of tRCD and the value of AL because the value of CL is equal to the value of tRCD.

FIG. 1A is a diagram illustrating an AL setting circuit of a conventional semiconductor memory device, and FIG. 1B is a detailed circuit diagram illustrating an AL decoder of the AL setting circuit shown in FIG. 1A.

Referring to FIG. 1A, in the AL setting circuit of the conventional semiconductor memory device, a signal EMRS1P is activated in a case where a mode register is set when a first bank address is received, and signals MREG<3> and MREG<4> are generated by latching external address codes (i.e., setting codes provided by a memory controller) A<3> and A<4> when an MRS signal is activated. Signals EM1REG<3> and EM1REG<4> are generated by latching the signals MREG<3> and MREG<4> in response to the signal EMRS1P. That is, in the mode register setting operation, MRS setting blocks 100 and 110 generate signals to be inputted to an AL decoder 120 by latching the input addresses.

Referring to FIG. 1B, the AL decoder 120 decodes the signals EM1REG<3> and EM1REG<4> and determines the values of AL setting signals AL0, ALCL_1 and ALCL_2 based on a result of the decoding. The decoding method of the AL decoder 120 is shown in Table 1.

TABLE 1

| EM1REG<4> | EM1REG<3> | AL |
|---|---|---|
| 0 | 0 | 0 (AL is disabled) |
| 0 | 1 | CL - 1 |
| 1 | 0 | CL - 2 |
| 1 | 1 | Reserved |

Referring to Table 1, when both external address codes A<3> and A<4> shift to a logic level 'L', and thus both the signals EM1REG<3> and EM1REG<4> are latched to a logic level 'L', only the $0^{th}$ code AL0 of the AL setting signals AL0, ALCL_1, and ALCL_2 is activated to a logic level 'H'. Thus, the value of AL maintains a value determined when the MRS was previously set or the value of AL becomes '0' so that the value of RL has the same state as the value of CL.

Furthermore, when the signal EM1REG<3> is latched to a logic level 'H' and the signal EM1REG<4> is latched to a logic level 'L' in response to the external address code A<3> of a logic level 'H' and the input address A<4> of a logic level 'L', only the first code ALCL_1 of the AL setting signals AL0, ALCL_1, and ALCL_2 is activated to a logic level 'H' so that the value of AL becomes a value in which 1 has been subtracted from the value of CL.

Furthermore, when the signal EM1REG<3> is latched to a logic level 'L' and the signal EM1REG<4> is latched to a logic level 'H' in response to the external address code A<3> of a logic level 'L' and the input address A<4> of a logic level 'H', only the second code ALCL_2 of the AL setting signals AL0, ALCL_1, and ALC_2 is activated to a logic level 'H' so that the value of AL has a value in which 2 has been subtracted from the value of CL.

Furthermore, when both the external address codes A<3> and A<4> become a logic level 'H', the value of AL should become the 'Reserved' state so that the value of AL has not been set. That is an operation of setting the value of AL should not be performed. Although not directly shown in the drawing, when the external address codes A<3> and A<4> have a logic level 'H' they are not transferred as the signals EM1REG<3> and EM1REG<4> so that all the AL setting signals AL0, ALCL_1, and ALCL_2 are not activated to a logic level 'H'. Accordingly, an operation of setting the value of AL is not generated. This method of preventing the operation of setting the value of AL from being generated, however, has a danger that may affect the operation of the AL setting circuit itself. Accordingly, as shown in the drawing, even when both the signals EM1REG<3> and EM1REG<4> are latched to a logic level 'H' in response to the external address codes A<3> and A<4> of a logic level 'H', only the $0^{th}$ code AL0 of the AL setting signals AL0, ALCL_1, and ALCL_2 may be activated to a logic level 'H'. Thus, the value of AL maintains a value determined when the MRS was previously set or the value of AL becomes '0' so that the value of RL has the same state as the value of CL. In this method, when the $0^{th}$ code AL0 of the AL setting signals AL0, ALCL_1, and ALCL_2 is activated to a logic level 'H', whether the value of AL will maintain a value determined when the MRS was previously set or whether the value of AL becomes '0' may be determined by a designed.

Meanwhile, in the case of a semiconductor memory device having a 3D structure using a through silicon via ("TSV"), the value of CL must be greater than tRCD due to a cause, such as a TSV load. Thus, assuming that the value of AL is the same, the value of RL of the semiconductor memory device having a 3D structure is greater than the value of RL of a conventional semiconductor memory device. In this case, timing at which the semiconductor memory device having a 3D structure outputs data is slower than timing at which the conventional semiconductor memory device outputs data.

To compensate for this delay, in the case of the semiconductor memory device having a 3D structure, the value of AL should be reduced by the value of CL that has increased due to a cause, such as a TSV load. That is, the value of AL may be able to be set to be smaller in the semiconductor memory device having a 3D structure than in the conventional semiconductor memory device.

The AL setting circuit of the conventional semiconductor memory device shown in FIGS. 1A and 1B does not include a construction for additionally setting the value of AL although the conventional semiconductor memory device has a 3D structure. Accordingly, there is a problem in that the conventional semiconductor memory device may not compensate for the delay.

Accordingly, a conventional circuit for setting the value of AL must be differently configured depending on whether a semiconductor memory device is a common semiconductor memory device or a semiconductor memory device having a 3D structure. This method is very inefficient.

SUMMARY

Exemplary embodiments of the present invention are directed to provide an AL setting circuit which is available in both a common semiconductor memory device and a semiconductor memory device having a 3D structure by differently setting a range in which the value of AL may be set depending on whether a semiconductor memory device is a common semiconductor memory device or a semiconductor memory device having a 3D structure.

In accordance with an embodiment of the present invention, an integrated circuit includes a plurality of mode register set (MRS) setting blocks configured to generate a plurality of additive latency (AL) codes in response to an MRS signal, and a decoding unit configured to decoding the plurality of AL codes in response to a stack information signal to generate a plurality of AL setting signals.

In accordance with another embodiment of the present invention, an integrated circuit includes at least one semiconductor memory device, the semiconductor memory device comprising, a decoding unit configured to generate a plurality of additive latency (AL) setting signals by decoding a plurality of AL codes when a mode register is set, and a decoding operation control unit configured to control an operation of the decoding unit to activate a reserved signal or a AL-complementary setting signal in response to a stack information signal when the plurality of AL codes have a given value.

DETAILED DESCRIPTION

Figure 1A:
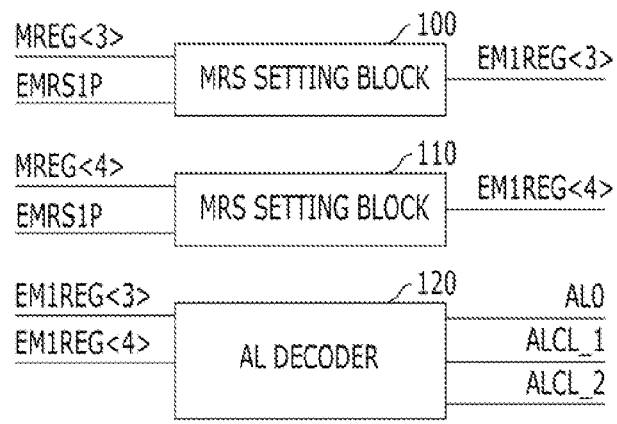
FIG. 1A is a diagram illustrating an AL setting circuit of a conventional semiconductor memory device.
Figure 1B:
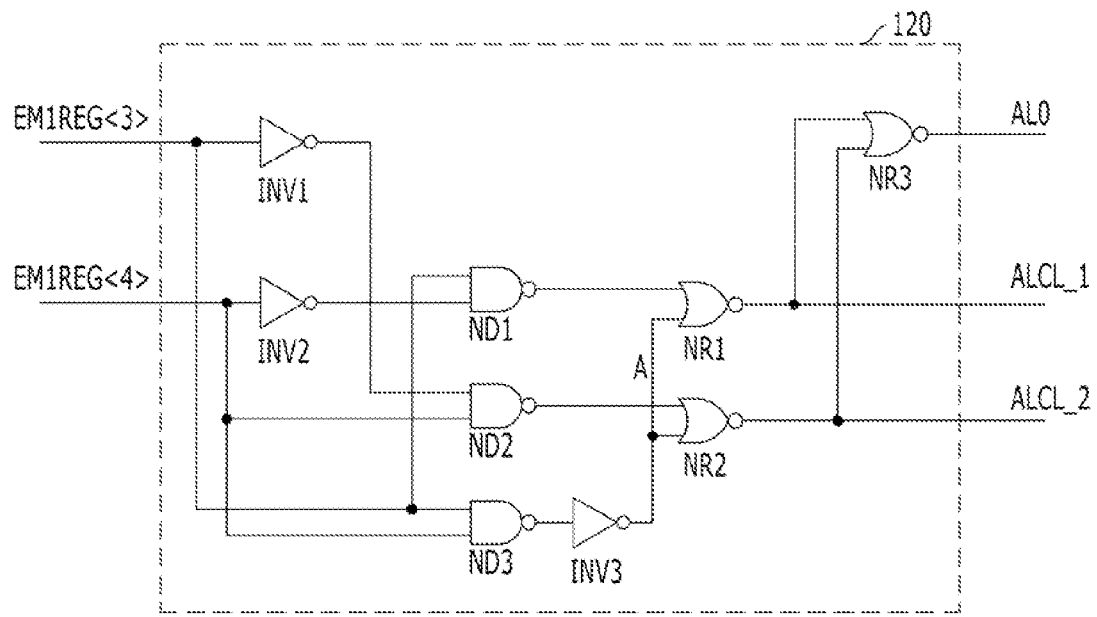
FIG. 1B is a detailed circuit diagram illustrating an AL decoder of the AL setting circuit shown in FIG. 1A.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2A:
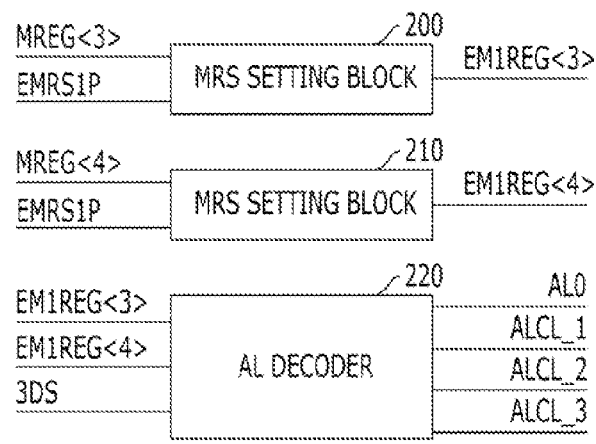
FIG. 2A is a diagram illustrating an AL setting circuit of a semiconductor memory device in accordance with an embodiment of the present invention.

FIG. 2A is a diagram illustrating an AL setting circuit of a semiconductor memory device in accordance with an embodiment of the present invention, and FIG. 26 is a detailed circuit diagram illustrating an AL decoder of the AL setting circuit shown in FIG. 2A.

Referring to FIG. 2A, in the AL setting circuit of a semiconductor memory device in accordance with an embodiment of the present invention, an MRS signal EMRS1P is activated in a case where a mode register is set when a certain bank address, e.g., a first bank address, is logic level 'H', and address codes MREG<3> and MREG<4> are generated by latching address codes A<3> and A<4> when an MRS command is applied. AL codes EM1REG<3> and EM1REG<4> are generated by latching the signals MREG<3> and MREG<4> in response to the signal EMRS1P. That is, in the mode register setting operation, MRS setting blocks 200 and 210 generate signals to be inputted to an AL decoder 220 by latching the external address codes. Accordingly, in the construction shown in FIG. 2A, addresses inputted when the mode register is set may become the signals EM1REG<3> and EM1REG<4>.

More particularly, referring to FIG. 26, the AL decoder 220 includes a decoding unit 240 and a decoding operation control unit 260. The decoding unit 240 is configured to generate a plurality of AL setting signals AL0, ALCL_1 and ALCL_2 by decoding the signals EM1REG<3> and EM1REG<4> when the mode register is set. The decoding operation control unit 260 is configured to control the operation of the decoding unit 240 so that a result of the decoding is outputted as the reserved signal AL0 or an AL-complementary setting signal ALCL_3 in response to a stack information signal 3DS when the signals EM1REG<3> and EM1REG<4> have the same value as a set value.

Here, the stack information signal 3DS is activated depending on whether a plurality of semiconductor memory devices are stacked or not. That is, if semiconductor memory devices are stacked, the stack information signal 3DS is activated to a logic level 'H', otherwise the stack information signal 3DS is disabled to a logic level 'L'. Furthermore, methods for determining a logic level of the stack information signal 3DS may include an electronic fuse option, an anti-fuse, and a method for directly receiving a value through a set pad, depending on the design.

TABLE 2

| EM1REG<4> | EH1REG<3> | 3DS | AL |
|---|---|---|---|
| 0 | 0 | X | 0 (AL disable) |
| 0 | 1 | X | CL - 1 |
| 1 | 0 | X | CL - 2 |
| 1 | 1 | 0 | Reserved |
|   |   | 1 | CL - 3 |

From Table 2, it can be seen that how the decoding operation control unit 260 may influence the operation of the decoding unit 240 in response to the operation of the decoding unit 240 and the stack information signal 3DS.

More particularly, when both the signals EM1REG<3> and EM1REG<4> are latched to a logic level 'L' irrespective of whether the stack information signal 3DS is activated to a logic level 'H' or disabled to a logic level 'L' only the $0^{th}$ code AL0 of the setting signals AL0, ALCL_1, and ALCL_2 is activated to a logic level 'H'. Thus, the value of AL maintains a value determined when the mode register was previously set or the value of AL becomes '0' so that the value of RL and the value of CL have the same state.

Furthermore, when the input address EM1REG<3> of a logic level 'H' and the input address EM1REG<4> of a logic level 'L' are inputted irrespective of a logic level of the stack information signal 3DS, the first code ALCL_1 of the setting signals AL0, ALCL_1, ALCL_2, and ALCL_3 is activated to a logic level 'H' so that the value of AL has a value in which 1 has been subtracted from the value of CL.

Furthermore, when the input address EM1REG<3> of a logic level 'L' and the input address EM1REG<4> of a logic level 'H' are inputted irrespective of the logic level of the stack information signal 3DS, the second code ALCL_2 of the codes AL0, ALCL_1, ALCL_2, and ALCL_3 is activated to a logic level 'H' so that the value of AL has a value in which 2 has been subtracted from the value of CL.

That is, the decoding unit 240 in accordance with the embodiment of the present invention uses an AL setting method used in a common semiconductor memory device when the signals EM1REG<3> and EM1REG<4> having values different from set values are received.

In contrast, if both the signals EM1REG<3> and EM1REG<4> become a logic level 'H', the decoding operation control unit 260 controls the decoding unit 240 so that the decoding unit 240 operates according to a different method in response to the stack information signal 3DS.

First, in a case where the stack information signal 3DS is disabled to a logic level 'L' when semiconductor memory devices do not have a stack structure, the value of AL becomes the 'Reserved' state so that the value of AL has not been set. That is, an operation of setting the value of AL should not be performed. Although not directly shown in the drawing, when the external address codes A<3> and A<4> have a logic level 'H', they are not transferred as the signals EM1REG<3> and EM1REG<4> so that all the AL setting signals AL0, ALCL_1, and ALCL_2 are not activated to a logic level 'H'. Accordingly, an operation of setting the value of AL is not generated. Thus, the value of AL maintains a value determined when the MRS was previously set or the value of AL becomes '0' so that the value of RL has the same state as the value of CL.

In contrast, in a case where the stack information signal 3DS is activated to a logic level 'H' when semiconductor memory devices have a stack structure, the AL-complementary setting signal ALCL_3 of the codes AL0, ALCL_1, ALCL_2, and ALCL_3 is activated to a logic level 'H' according as both the signals EM1REG<3> and EM1REG<4> become a logic level 'H'.

Figure 2B:
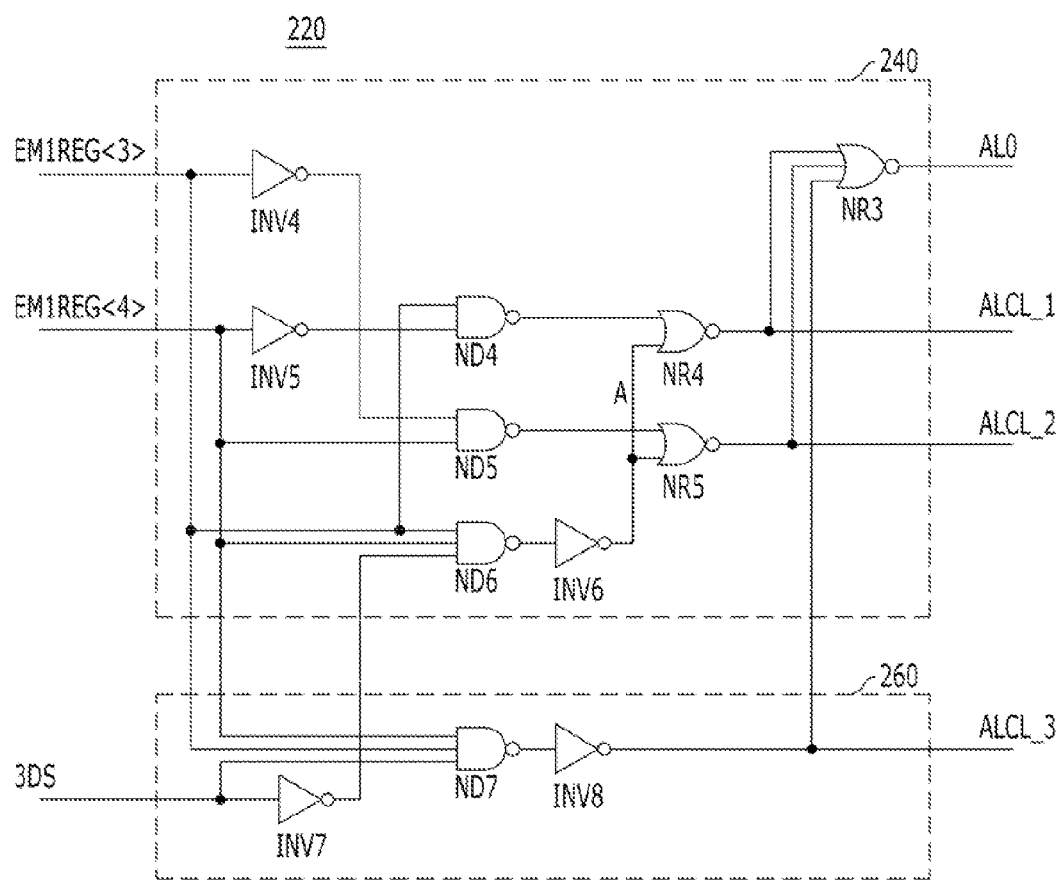
FIG. 2B is a detailed circuit diagram illustrating an AL decoder of the AL setting circuit shown in FIG. 2A.

That is, as shown in FIG. 2B, when both the signals EM1REG<3> and EM1REG<4> become a logic level 'H', the decoding operation control unit 260 controls the decoding unit 240 to have a different output in response to the stack information signal 3DS. Accordingly, the AL-complementary setting signal ALCL_3 is meaningful only in a semiconductor memory device having a 3D structure while remaining in a disable state in any case in a common semiconductor memory device. As a result, an AL setting operation may be easily extended in a semiconductor memory device having a 3D structure while having no influence on the AL setting operation of a common semiconductor memory device.

As described above, the AL setting circuit of a semiconductor memory device in accordance with an embodiment of the present invention may vary a range of an AL setting operation depending on whether a semiconductor memory device has a 3D structure or not.

Furthermore, in the above-described operation of the decoding operation control unit 260, the reserved signal AL0 has been illustrated as being identical with the $0^{th}$ code AL0 of the AL setting signals AL0, ALCL_1, and ALCL_2. This is based on the following reasons, and other cases are possible depending on a designer's choice.

First, when both the external address codes A<3> and A<4> become a logic level 'H', and the value of AL becomes the 'Reserved' state, the value of AL should not have been set. That is, an operation of setting the value of AL should not be performed. Accordingly, although not directly shown in the drawing, when the external address codes A<3> and A<4> are a logic level 'H' they are not transferred as the signals EM1REG<3> and EM1REG<4> so that all the AL setting signals AL0, ALCL_1, and ALCL_2 are not activated to a logic level 'H' to prevent an operation of setting the value of AL from being performed. This method of preventing the operation of setting the value of AL from being performed, however, has a danger that may freeze up the operation of the AL setting circuit itself. Furthermore, if the AL-complementary setting signal ALCL_3 used only in the semiconductor memory device having a 3D structure is used even in a common semiconductor memory device instead of the 'Reserved' state of the value of AL, the common semiconductor memory device not having a 3D structure may malfunction because the AL-complementary setting signal ALCL_3 has an AL setting value never used in a common semiconductor memory device.

Accordingly, as shown in the drawing, even when both the external address codes A<3> and A<4> become a logic level 'H', and thus both the signals EM1REG<3> and EM1REG<4> are latched to a logic level 'H', only the 0$^{th}$ code AL0 of the AL setting signals AL0, ALCL_1 and ALCL_2 is activated to a logic level 'H'. Thus, the value of AL maintains a value determined when the mode register was previously set or the value of AL is set to '0' so that the value of RL and the value of CL have the same state. Here, whether the value of AL will maintain a value determined when the mode register was previously set or the value of AL will be set to '0' when the 0$^{th}$ code AL0 of the AL setting signals AL0, ALCL_1, and ALCL_2 is activated to a logic level 'H' may be determined by a designer.

Furthermore, unlike the drawing, the reserved signal of AL may disable all the AL setting signals AL0, ALCL_1, ALCL_2, and ALCL_3 to a logic level 'L' depending on a designer's choice. If the reserved signal of AL disables all the AL setting signals AL0, ALCL_1, ALCL_2, and ALCL_3 to a logic level 'L' in a semiconductor memory device not having a 3D structure, when the external address codes A<3> and A<4> are a logic level 'H', control has to be performed so that the external address codes A<3> and A<4> are not transferred as the signals EM1REG<3> and EM1REG<4>. In this case, the operations of the MRS setting blocks 200 and 210 will be enabled/disabled in response to the stack information signal 3DS. In other words, in a common semiconductor memory device, when the external address codes A<3> and A<4> are a logic level 'H', the MRS setting blocks 200 and 210 perform control so that the external address codes A<3> and A<4> are not transferred as the signals EM1REG<3> and EM1REG<4>. In a semiconductor memory device having a 3D structure, even when the external address codes A<3> and A<4> are a logic level 'H', the MRS setting blocks 200 and 210 will operate so that the external address codes A<3> and A<4> are transferred as the signals EM1REG<3> and EM1REG<4>.

As described above, if the embodiment of the present invention is applied, the value of AL may be controlled so that it is set in a different range depending on whether a semiconductor memory device is a common semiconductor memory device or a semiconductor memory device having a 3D structure. Accordingly, one AL setting circuit may be applied to the common semiconductor memory device and the semiconductor memory device having a 3D structure at the same time.

For example, in the above-described embodiment, AL setting values available without malfunction in a common semiconductor memory device has been illustrated as being ALCL_1, and ALCL_2 and an AL setting value that is meaningful only in a semiconductor memory device having a 3D structure has been illustrated as being ALCL_3, but they are only illustrative for convenience of description. That is, the AL setting values available without malfunction in a common semiconductor memory device may include ALCL_3, ALCL_3, ALCL_4, ALCL_5, etc. in addition to ALCL_1 and ALCL_2. In this case, the AL setting value meaningful only in a semiconductor memory device having a 3D structure may include ALCL_6, ALCL_7 etc. that have a wider range than the AL setting values available without malfunction in the common semiconductor memory device.

In other words, the scope of the present invention includes the AL setting circuit that is applicable to a common semiconductor memory device and a semiconductor memory device having a 3D structure at the same time without any concern even when a range of AL setting values that may be set only in a semiconductor memory device having a 3D structure is wider than a range of AL setting values that may be set in a common semiconductor memory device.

Furthermore, in the embodiment of the present invention, the circuit for setting the value of AL when a mode register is set has been illustrated, but this is only an embodiment. For example, an operation of setting all options that may be set by a mode register setting operation, such as an operation of setting CL or an operation of setting write recovery, will be included in the scope of the present invention.

Furthermore, in the above-described embodiment, the positions and types of the logic gates and the transistors have to be differently embodied depending on the polarity of an input signal.

In accordance with the present invention, the value of AL is controlled so that it is set in a different range depending on whether a semiconductor memory device is a common semiconductor memory device or a semiconductor memory device having a 3D structure. Accordingly, there may be an advantage in that one AL setting circuit may be applied to a common semiconductor memory device and a semiconductor memory device having a 3D structure at the same time.

While the present invention has been described with respect to the specific embodiments, it will be apparent to those skilled in the art that various changes and modifications may be made without departing from the spirit and scope of the invention as defined in the following claims.

What is claimed is:

1. An integrated circuit comprising:
a plurality of mode register set (MRS) setting blocks configured to generate a plurality of additive latency (AL) codes in response to an MRS signal;
a decoding unit configured to decoding the plurality of AL codes in response to a stack information signal to generate a plurality of AL setting signals; and
a decoding operation control unit configured to control an operation of the decoding unit to activate a reserved signal or a AL-complementary setting signal in response to a stack information signal when the plurality of AL codes have a given value,
wherein the stack information signal is activated when the integrated circuit includes a plurality of stacked semiconductor memory devices, and
wherein the decoding operation control unit controls the decoding unit to activate the reserved signal in response to the plurality of AL codes of the given value in a case where the stack information signal is deactivated.

2. The integrated circuit of claim 1, wherein the plurality of MRS setting blocks each includes a latch configured to latch a corresponding address code in response to the MRS signal.

3. The integrated circuit of claim 1, wherein the stack information signal is activated when the integrated circuit includes a plurality of stacked semiconductor memory devices.

4. An integrated circuit comprising at least one semiconductor memory device, the semiconductor memory device comprising:
a decoding unit configured to generate a plurality of additive latency (AL) setting signals by decoding a plurality of AL codes when a mode register is set; and
a decoding operation control unit configured to control an operation of the decoding unit to activate a reserved signal or a AL-complementary setting signal in response to a stack information signal when the plurality of AL codes have a given value, wherein the stack information signal is activated when the integrated circuit includes a plurality of stacked semiconductor memory devices, and wherein the decoding operation control unit controls the decoding unit to activate the reserved signal in response to the plurality of AL codes of the given value in a case where the stack information signal is deactivated.

5. The integrated circuit of claim 4, wherein the decoding unit selectively activates any one of the plurality of AL setting signals in response to the plurality of AL codes when the mode register is set.

6. The integrated circuit of claim 5, wherein the semiconductor memory device determines a value of AL for a read operation in response to the selectively activated AL setting signal or the activated AL-complementary setting signal, when the mode register is set.

7. The integrated circuit of claim 5, wherein the semiconductor memory device maintains a previous value of AL or sets the value of AL to '0' in response to the activated reserved signal, when the mode register is set.

8. The integrated circuit of claim 4, wherein the decoding operation control unit controls the decoding unit to activate the AL-complementary setting signal in response to the plurality of AL codes of the given value in a case where the stack information signal is activated.

* * * * *